United States Patent [19]
Tsuda et al.

[11] 3,944,921
[45] Mar. 16, 1976

[54] LOGIC LEVEL TEST PROBE WITH GRATED OSCILLATOR

[75] Inventors: Shin Tsuda, Hasuda; Ryozo Hiraga, Yokohama, both of Japan

[73] Assignee: Canon Kabushiki Kaisha, Tokyo, Japan

[22] Filed: Feb. 13, 1974

[21] Appl. No.: 442,044

Related U.S. Application Data

[62] Division of Ser. No. 206,286, Dec. 9, 1971, Pat. No. 3,805,155.

[30] Foreign Application Priority Data

| Dec. 11, 1970 | Japan | 45-110309 |
| Dec. 11, 1970 | Japan | 45-110310 |
| Dec. 11, 1970 | Japan | 45-110311 |
| Sept. 28, 1971 | Japan | 46-75622 |
| May 31, 1971 | Japan | 46-37625 |

[52] U.S. Cl. ............................ 324/133; 324/72.5
[51] Int. Cl.² .................... G01R 31/02; G01R 19/16
[58] Field of Search ............... 324/51, 72.5, 133; 307/235; 331/49; 340/248 A, 248 B, 248 C, 248 D

[56] References Cited
UNITED STATES PATENTS

| 2,437,876 | 3/1948 | Cohn | 340/248 D X |
| 2,457,288 | 12/1948 | Usselman | 331/49 X |
| 3,021,514 | 2/1962 | Regis et al. | 324/133 X |
| 3,207,995 | 9/1965 | Beer et al. | 331/49 X |
| 3,503,062 | 3/1970 | Witzke et al. | 340/248 B X |
| 3,543,154 | 11/1970 | Gordon | 324/72.5 X |
| 3,619,775 | 11/1971 | Naylor et al. | 324/133 X |
| 3,628,141 | 12/1971 | Union et al. | 324/133 X |
| 3,742,351 | 6/1973 | Palmer et al. | 324/133 X |
| 3,750,015 | 7/1973 | Sheker et al. | 324/72.5 |

OTHER PUBLICATIONS

Gordon, Gary B. *IC Logic Checkout Simplified*, Hewlett Packard Journal, June, 1969 p. 14–16.

*Primary Examiner*—Gerard R. Strecker
*Attorney, Agent, or Firm*—Fitzpatrick, Cella, Harper & Scinto

[57] ABSTRACT

An electronic circuit test equipment generates signals indicative of electrical conditions of a desired point in a circuit under test. The signals may be audible. light signals or combination thereof.

12 Claims, 25 Drawing Figures

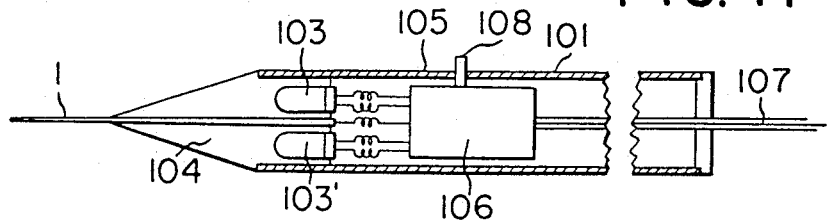
FIG. 17
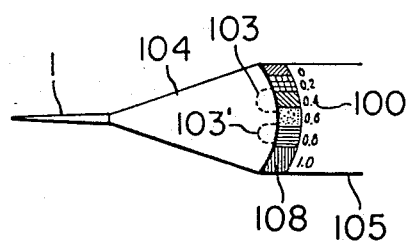
FIG. 18
FIG. 20
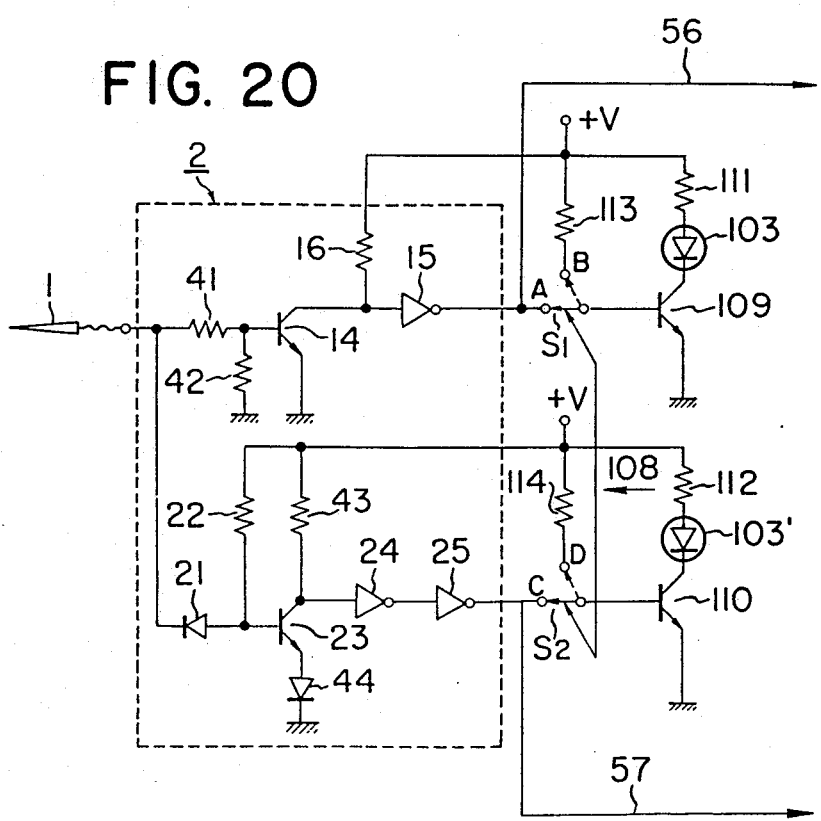

LOGIC LEVEL TEST PROBE WITH GRATED OSCILLATOR

This is a division of application Ser. No. 206,286 filed Dec. 9, 1971, now U.S. Pat. No. 3,805,155.

BACKGROUND OF THE INVENTION

1. Field of the Invention

The present invention relates generally to an electronic circuit test equipment in which the electrical conditions such as voltage level, single pulse, pulse train or the like at a desired point in an electronic circuit are converted into the audible frequency signals so that an operator can readily distinguish the electrical conditions.

2. Description of the Prior Art

With the advancement of the microminiaturization techniques, the electronic circuits and component parts are extensively made compact in size. In testing or measuring these circuits and component parts, testers and oscilloscopes are generally used. In the testers and oscilloscopes, their probes and display sections are separated so that an operator must keep the probe in contact with a desired check point in a circuit or the like while he watches the pointer or voltage or current waveforms being displayed. In this case, he must check the desired test point, make the probe in contact with it, and thereafter watch the waveforms or the like. Therefore, the disconnection of the probe from the test point occurs very often while he is watching because he turns his eyes away from the probe. In some cases, the probe is made into contact with an undesired point in the circuit, and in the worst case the probe causes shortcircuit, thus causing the breakdown of the circuits or the component parts.

SUMMARY OF THE INVENTION

One of the objects of the present invention is therefore to provide an electronic circuit test equipment which is capable of indicating the electrical conditions of a desired test point in a circuit by easily distinguishable audio signals, whereby an operator can easily test the circuit without turning his eyes from the probe.

Another object of the present invention is to provide an electronic circuit test equipment in which the outputs of two oscillators having different oscillation frequencies are converted into the audible signals by an electroacoustic transducer.

Another object of the present invention is to provide an electronic circuit test equipment which incorporates only one oscillator, but is capable of producing the audible signals of different frequencies.

Another object of the present invention is to provide an electronic circuit test equipment which incorporates monostable multivibrators in order to increase the pulse duration or to sample the pulses in case of testing a single pulse or pulse trains.

Another object of the present invention is to provide an electronic circuit test equipment which is simple in construction and light in weight.

Another object of the present invention is to provide an electronic circuit test equipment in which illumination means is attached to the probe to illuminate a desired test point in a circuit.

Another object of the present invention is to provide an electronic circuit test equipment which, in addition to the test of electrical conditions of a desired test point in a circuit, is capable of measuring the duty cycle of a pulse when an operator observes the color of light emitted from the head of the probe, said color being the mixture of two colors of light emitted from at least two illumination elements emitting light of different wavelengths, said illumination elements being also used to illuminate a desired test point.

Prior to the description of the preferred embodiments of the present invention, some terms used in this specification will be explained. The terms "high and low level signals" are used to refer to two discrete values of voltage or current. For example, the high level signal may be +15 V, whereas the low level signal may be +10 V. That is, these terms are similar in meaning to "0" and "1", "positive" and "negative" and the like used in the binary logic circuit technology. It should be noted that since the present invention intends to indicate a plurality of electrical conditions by a plurality of audible signals of different frequencies, the electrical conditions are not limited to the above explained "high and low level" states, and three discrete electrical conditions such as (+, −, and 0) can be also detected as will be described in more detail hereinafter.

BRIEF DESCRIPTION OF THE DRAWING

FIG. 17 is a sectional view of a probe assembly similar in construction to that shown in FIG. 15 except that two illumination means are incorporated therein;

FIG. 18 is fragmentary side view thereof used to explain the color codes attached thereto;

FIG. 20 is a part of the circuit incorporated in the probe assembly shown in FIG. 17;

Some parts are designated by same reference numerals throughout the figures.

DESCRIPTION OF THE PREFERRED EMBODIMENTS

Figure 1:
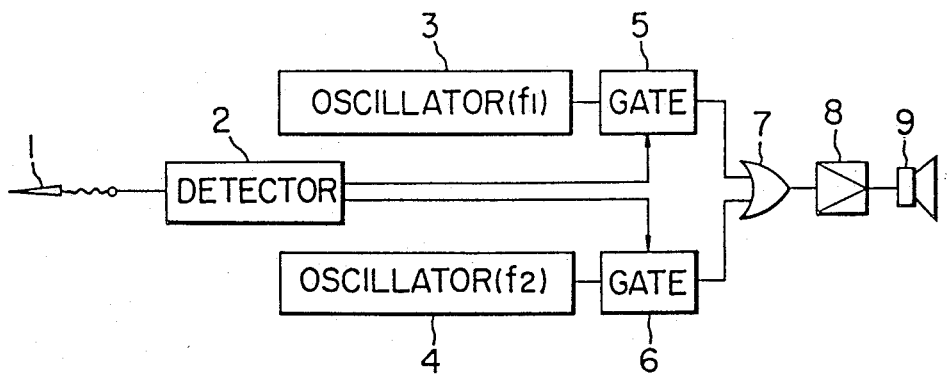
FIG. 1 is a block diagram used to explain the underlying principle of the present invention.

Referring to FIG. 1 illustrating the underlying principle of the present invention, a probe 1 is used for detecting the voltage at a desired point of a circuit to be tested, and the detected voltage is further detected by a detector 2 whether it is a high level pulse or lower level pulse. In response to the outputs from the detector 2, gates 5 and 6 control oscillators 3 and 4, respectively, which generate the frequencies $f_1$ and $f_2$, respectively. The outputs of the gates 5 and 6 are transmitted through an OR gate 7 to an amplifier 8 which drives a transducer such as a loudspeaker 9. It should be noted that the arrangement itself of the amplifier 8 does not constitute the present invention since it may sufficiently drive a small-size speaker when the output impedance of the OR gate 7 is low, and the amplitude of the output therefrom is of the order of 5 volts.

Next the mode of operation of the basic circuit described above with reference to FIG. 1 will be described. When the high level voltage is detected by the detector 2, the gate 5 is opened, and the output with the frequency of $f_1$ is transmitted through the OR gate 7 to the amplifier 8, where the output signal is amplified to drive the speaker or transducer 9. Thus, the audio signal is heard through the transducer 9. When the detector 2 detects a low level voltage, the gate 6 is opened, and the output of $f_2$ of the oscillator 4 is heard through the transducer 9. Thus, the condition or function of the circuit under test can be distinguished by the operator from the two different frequency audio signals heard through the transducer 9. When the probe 1 is not in contact with the circuit, both of the gates 5 and 6 are closed so that no audio signal is heard through the transducer 9, that is, the transducer 9 is silent. When the electrical conditions of the circuit to be tested are a train of repetitive pulses, a train of two different tones of $f_1$ and $f_2$ of the oscillators 3 and 4 are heard through the transducer 9 in a manner similar to that described above. Thus, a train of repetitive pulses can be detected.

Figure 2:
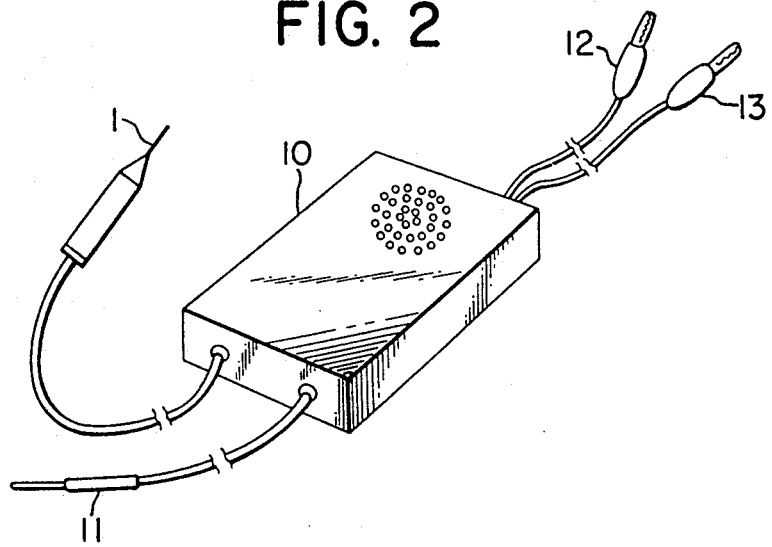
FIG. 2 is a perspective view of one embodiment of an electronic circuit test equipment in accordance with the present invention.

FIG. 2 is a perspective view of an electronic circuit test equipment in accordance with the present invention. The circuits shown in FIG. 1 are all incorporated in a casing 10 which has lead lines 12 and 13 for connection to the power source of a circuit being tested and to the ground, and grounding terminal 11 which may be used for continuity test. That is, when the audio signal is heard through the transducer 9, the circuit being tested is in continuty, whereas when no tone is heard, the circuit is short-circuited.

Figure 3:
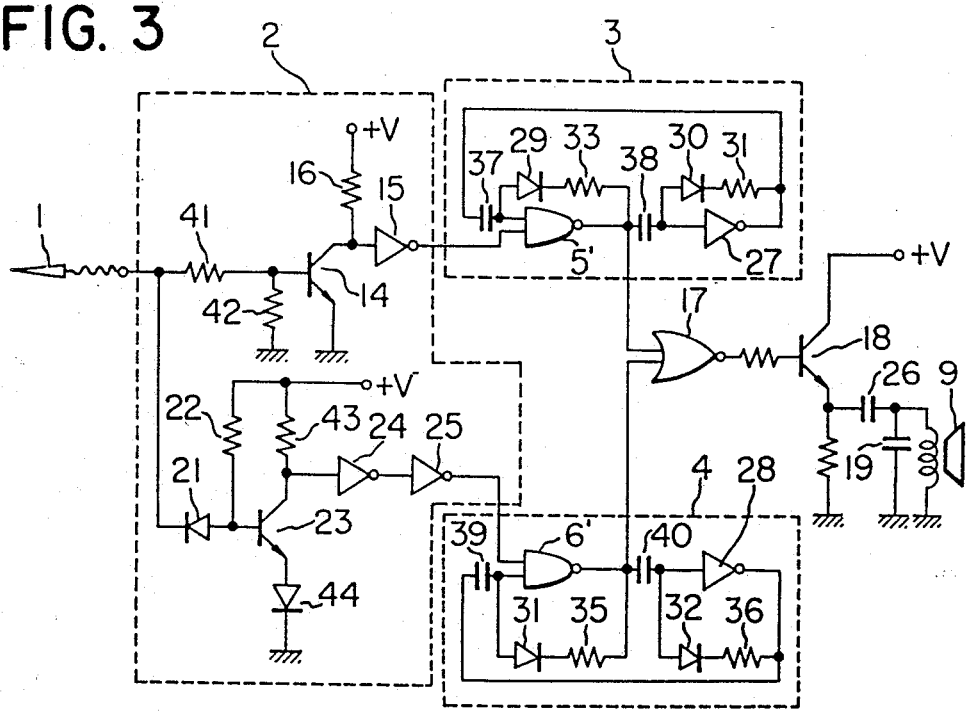
FIG. 3 is a practical circuit diagram of the circuit shown in FIG. 1.

FIG. 3 is a practical circuit diagram of the circuit shown in FIG. 3. The detector 2 comprises, in general, a high-level and low-level signal detectors. The high level detector comprises resistors 41, 42 and 16, a transistor 14, and an inverter 15, whereas the low level detector comprises resistors 22 and 43, diodes 21 and 44, a transistor 23 and inverters 24 and 25. In the instant embodiment, astable multivibrators are used as oscillators 3 and 4. The first astable multivibrator 3 comprises a NAND circuit 5', an inverter 27, diodes 29 and 30, resistors 33 and 34 and capacitors 37 and 38, whereas the second astable multivibrator 4 has a similar arrangement. It should be noted that NAND circuits 5' and 6' in FIG. 3 correspond to the gates 5 and 6 in FIG. 1, and that a NOR circuit 17 corresponds to the OR circuit 7. The amplifier 8 is an emitter-follower transistor 17, and the transducer 9 comprises two capacitors 19 and 26, and a small-size loudspeaker. It is understood that the buzzer or the like may be used instead of the speaker.

Next the mode of operation will be described hereinafter. It is assumed that the circuit being tested has the high level voltage. When the high level voltage is detected by the probe 1, the base voltage of the transistor 14 is raised to conduct it. The input voltage of the inverter 15 is decreased, and the output voltage is increased to open the NAND circuit 5'. Since the NAND circuit 5' has a function of controlling the output of the astable multivibrator 3, the output thereof is fed to the gate of the output transistor 18 through the NOR circuit 17. Therefore, the transistor 18 is conducted to drive the speaker or transducer 9. In this case, the high frequency components are bypassed through the capacitor 19 so that the audio signal is heard through the transducer 9 so long as the astable multivibrator 3 is set to an audible frequency $f_1$. Thus, the operator may now know that the electrical condition in the circuit under test is at the high voltage level state. In this case, the transistor 23 is also conducted, but because of the provision of the inverters 24 and 25, the NAND circuit 6' is not opened so that the output of the oscillator or astable multivibrator 4 is not heard. On the other hand, when the circuit under test has a low voltage level, the base potential of the transistor 23 is decreased because of the diode 21 and the resistor 22. As a result, the transistor 23 is non-conductive so that its collector output is increased. The collector output voltage is transmitted through the two inverters 24 and 25 to the NAND circuit 6' to conduct it. Therefore, the output of the astable multivibrator 4 is transmitted to the transistor 18 through the NOR circuit 17, whereby the transistor 18 is conducted, thereby driving the transducer 9. As a result, the operator can hear the tone of $f_2$ of the oscillator or astable multivibrator 4 through the transducer 9. In this case, the base potential of the transistor 14 is decreased whereby the transistor 14 is turned off. As a result, the output of the oscillator 3 is not heard through the transducer 9.

When a train of repetitive pulses are the electrical condition of the circuit under test, the above two operations are alternately repeated so that the tones of $f_1$ and $f_2$ are alternately heard through the transducer 9.

In summary, when the probe 1 is made into contact with the circuit under test, and if the electrical condition is a high voltage level, the tone of $f_1$ is heard. If the electrical condition is a low voltage level, the tone of $f_2$ is heard. If the electrical condition is a train of repetitive pulses, the tones of $f_1$ and $f_2$ are alternately heard. When the probe 1 is not in contact with the circuit, no tone is heard through the transducer 9, that is the transducer 9 is silent. Thus, the operator can immediately detect the high and low voltage levels, and the pulse trains in the circuit under test by hearing the two different tones through the transducer. Therefore, the circuit can be tested efficiently and safely without the operator viewing the display device such as a cathode-ray tube, oscilloscope or the like.

Figure 4:
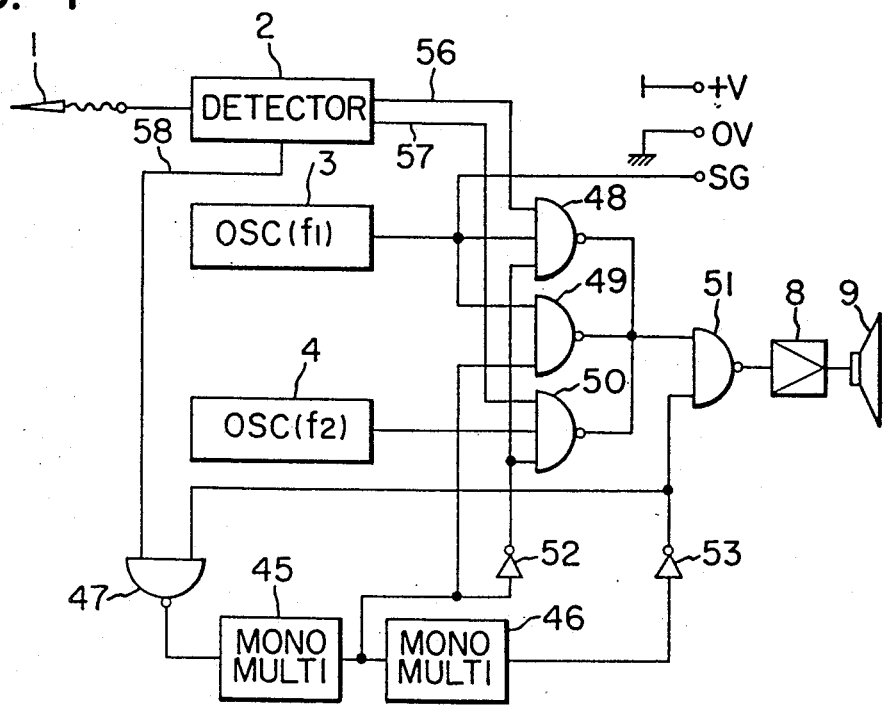
FIG. 4 is a block diagram of another embodiment of the present invention adapted to more clearly detect a single pulse and a pulse train.

The second embodiment to be described hereinafter with reference to FIG. 4 is best suited for more clearly detecting a single pulse and a pulse train, whereby the function of the test equipment is much improved.

The test equipment illustrated in FIG. 4 comprises in general the probe 1, the detector 2, the oscillators 3 and 4 of the oscillation frequencies $f_1$ and $f_2$, all of which are similar in function to those described in the first embodiment, monostable multivibrators 45 and 46, NAND circuits 47–51, inverters 52 and 53, the amplifier 8 and the transducer 9. The monostable multivibrator 45 is triggered by the leading or rising edge of the single pulse, whereas the multivibrator 46 is triggered by the rising edge of the trigger pulse of the vibrator 45.

Next the mode of operation will be described. When the detector 2 detects a high voltage level, the output of the detector 2 is fed to the NAND circuit 48 through line 56. Since the output of the oscillator 3 and the inverted output of the monostable multivibrator 45 are applied to the NAND circuit 48, when the output of the detector 2 is applied, the NAND circuit 48 is opened so that the output of the oscillator 3 is fed to the NAND circuit 51. Since the inverted output of the monostable multivibrator 46 is applied to the NAND circuit, it is opened when the output of the oscillator 3 is applied thereto. As a result, the output of the oscillator 3 is amplified by the amplifier 8, and the tone of $f_1$ is heard through the transducer 9. Thus, the operator can detect the high voltage level condition in the circuit under test when the tone of $f_1$ is heard.

When the electrical condition in the circuit under test is a low voltage level, the output representing the low voltage level is applied to the NAND circuit 50 through the line 57 to open it. Therefore the output of the oscillator 4 is amplified by the amplifier, and the tone of $f_2$ is heard through the transducer 9. Thus, the operator can detect the low voltage level in the circuit under test.

When the circuit under test generates a single pulse, the detection is different depending upon whether the electrical condition of the circuit under test is a low voltage level when the high level single pulse is generated or a high voltage level when the low level single pulse is generated. First the former case will be described with further reference to FIG. 5A. When the probe 1 is made into contact with the circuit under test, the output of the oscillator 4, that is the tone of $f_2$ is heard through the transducer 9. When the single pulse arrives at the time $t_1$, the electrical condition becomes a high voltage level so that the output of the oscillator 3, that is, the tone of $f_1$ is heard because the NAND circuit 48 is opened. When the trailing edge of the pulse falls, the monostable multivibrator 45 is triggered to a high level. The high level output is inverted by the inverter 52 to close the NAND circuits 48 and 50, whereas the NAND circuit 49 is opened so that the tone of the oscillator 3 of $f_1$ is heard through the transducer 9. At the time $t_3$ which is determined by the time constant of the monostable multivibrator 45, the output of the multivibrator 45 is shifted from the high to low level so that the NAND circuit 49 is closed, whereas the NAND circuits 48 and 50 are opened. In this case, the monostable multivibrator 46 is triggered to a high level state, and the high level signal is inverted by the inverter 53 to close the NAND circuit 51. During the time the NAND circuit 51 is closed, that is during the time the output of the multivibrator 46 is in the high level state, the transducer is silent. At the time $t_4$ which is determined by the time constant of the monostable multivibrator 46, it is shifted to the low level state. As a result, the tone of $f_2$ of the oscillator 4 is heard again through the transducer 9. Thus, the high level single pulse can be detected.

Figure 5A:
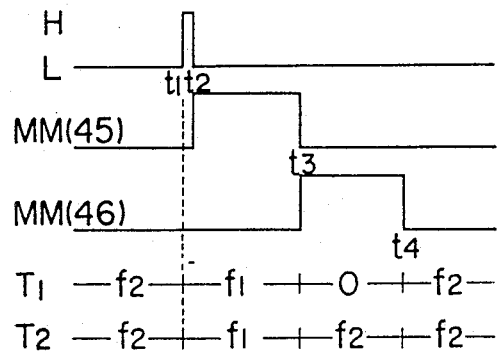
FIGS. 5A, 5B and 5C are timing charts used for explanation of the modes of operation of the embodiments shown in FIGS. 4 and 6.
Figure 5B:
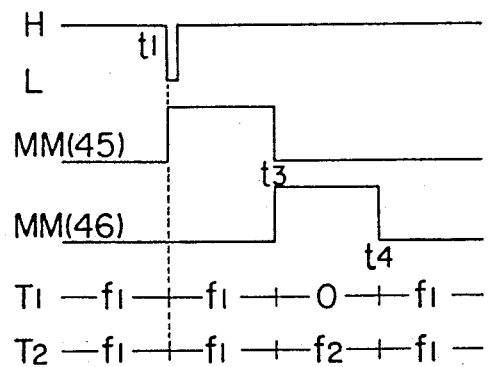

Next with reference to FIG. 5B, the detection of the single low level pulse when the condition in the circuit under test is in the high voltage state will be described. Since the initial condition is in the high level state, the tone of $f_1$ is heard since the NAND circuits 48 and 51 are opened to transmit the output of the oscillator 3 of $f_1$ to the transducer through the amplifier 8. At the time $t_1$ when the single pulse arrives, the circuit under test is shifted to the low level state. As a result, the trailing or falling edge of the single pulse triggers the monostable multivibrator 45 to shift to the high level state. In response to the high level output of the multivibrator 45, the NAND circuit 49 is opened, whereas the NAND circuits 48 and 50 are closed in response to the inverted high level output from the inverter 52. As a result, the output of the oscillator 3 is transmitted through the NAND circuit 49, and the tone of $f_1$ is heard as long as the monostable multivibrator 45 is in the high level state. At the time $t_2$ which is determined by the time constant of the multivibrator 45, it is shifted from the high to low level state, and in response to the low level signal, the monostable multivibrator 46 is triggered to the high level state, and the NAND circuits 48 and 50 are opened, whereas the NAND circuit 49 is closed.

The high level output of the monostable multivibrator 46 which is inverted by the inverter 53, closes the NAND circuit 51 a time interval which is determined by the time constant of the monostable multivibrator 46. As a result, the transducer remains silent. When the multivibrator 46 is shifted to the low level state at the time $t_4$, the NAND circuit 51 is opened, and the tone of $f_1$ is heard again through the transducer 9 because the circuit under test is in the high level state. Thus, the low level single pulse can be detected.

As described hereinabove, the oscillation frequencies of the monostable multivibrators are used in the second embodiment for detection of a single positive or negative pulse. Clearer tones can facilitate the detection.

Figure 5C:
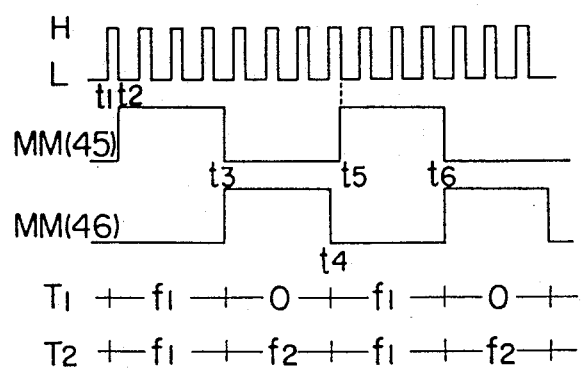

Next with reference to FIG. 5C, a detection of a pulse train will be described. As described above, the monostable multivibrator 45 is triggered at the time $t_2$ when the first pulse of the pulse train falls so that the NAND circuit 49 is opened whereas the NAND circuits 48 and 50 are closed. As a result, the output of the oscillator 3 is permitted to pass through the NAND circuit 48 so that the tone of frequency $f_1$ is heard through the transducer so long as the multivibrator 45 is in the high level state during the time determined by the time constant thereof. When the multivibrator 45 is shifted to the low level state at the time $t_3$, the multivibrator 46 is triggered to the high level state. As a result, the NAND circuit 51 is closed, whereby the transducer remains silent so long as the multivibrator 46 is in the high level state. The output of the inverter which closes the NAND circuit 51 is fed to one of the input terminals of the NAND circuit 47, whereby the latter is closed. As a result, the pulse train is not applied to the multivibrator 45. As long as the monostable multivibrator 46 is in the high level state, the NAND circuit 47 is closed, so that the multivibrator 45 is not triggered and remains in the stable state. At the time $t_4$, the multivibrator 46 is shifted from high to low level state so that the NAND circuits 47 and 51 are opened. As a consequence, the multivibrator 45 is triggered again in response to the falling edge of the first pulse of the pulse train, and the operations described hereinabove are cycled. Thus, the intermittent tone of $f_1$ is heard, whereby the operator can detect the pulse train in the circuit under test. The frequencies actually heard by the operator are plotted in time at $T_1$ in FIGS. 5A, 5B and 5C. However, it should be noted that these series of frequencies to be heard may be changed as will be described hereinafter.

Figure 6:
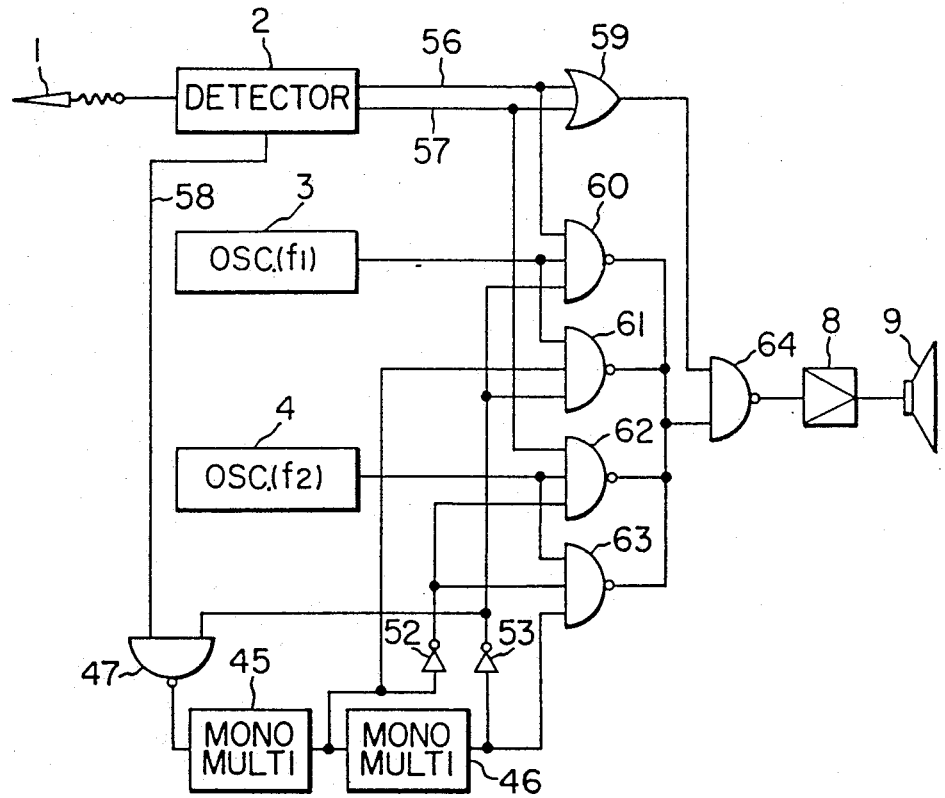
FIG. 6 is a block diagram of another embodiment of the present invention.

The third embodiment of the test equipment in accordance with the present invention is illustrated in FIG. 6, in which those parts similar to those shown in FIGS. 1 and 2 are designated by same reference numerals. Depending upon the high and low level states of the circuit under test the tones of $f_1$ and $f_2$ are heard through the transducer 9 respectively. When the single positive pulse is fed into the circuit under test as shown in FIG. 5A, the monostable multivibrator 45 is triggered to open the NAND circuit 51. As a result, the tone of $f_1$ is heard so long as the multivibrator 45 is in the high level state. When the multivibrator 45 is shifted to the low level state so that the multivibrator 46 is triggered, a NAND circuit 63 is opened so that the tone of $f_2$ is heard. Thereafter, the tone of $f_2$ is continuously heard since the circuit under test is in the low level state. Thus, the operator can detect the single positive pulse. The series of the frequencies of the tones heard are plotted at $T_2$ in FIG. 5A. Similarly as shown at $T_2$ in FIGS. 5B and 5C, the tone of $f_1$ is heard as long as the multivibrator 45 is triggered, and the tone of $f_2$ is heard so long as the multivibrator 46 is triggered.

In addition to the tone frequency series $T_1$ and $T_2$, four other tone frequency series are possible since the permutation for assigning the frequencies $f_1, f_2$ and 0 to the time $\tau_1$ and $\tau_2$ at which the two monostable multivibrators are in the high level states respectively is $_3P_2 = 6$, as shown in the Table below:

| Tone frequency series | $T_1$ | $T_2$ | $T_3$ | $T_4$ | $T_5$ | $T_6$ |
|---|---|---|---|---|---|---|
| $\tau_1$ | $f_1$ | $f_1$ | $f_2$ | $f_2$ | 0 | 0 |
| $\tau_2$ | 0 | $f_2$ | 0 | $f_1$ | $f_1$ | $f_2$ |

The tone frequency series $T_1$ and $T_2$ can be attained by the second and third embodiments described with reference to FIGS. 4–6, and it is obvious to those skilled in the art to modify these embodiments to attain the series $T_3 - T_6$.

Figure 8:
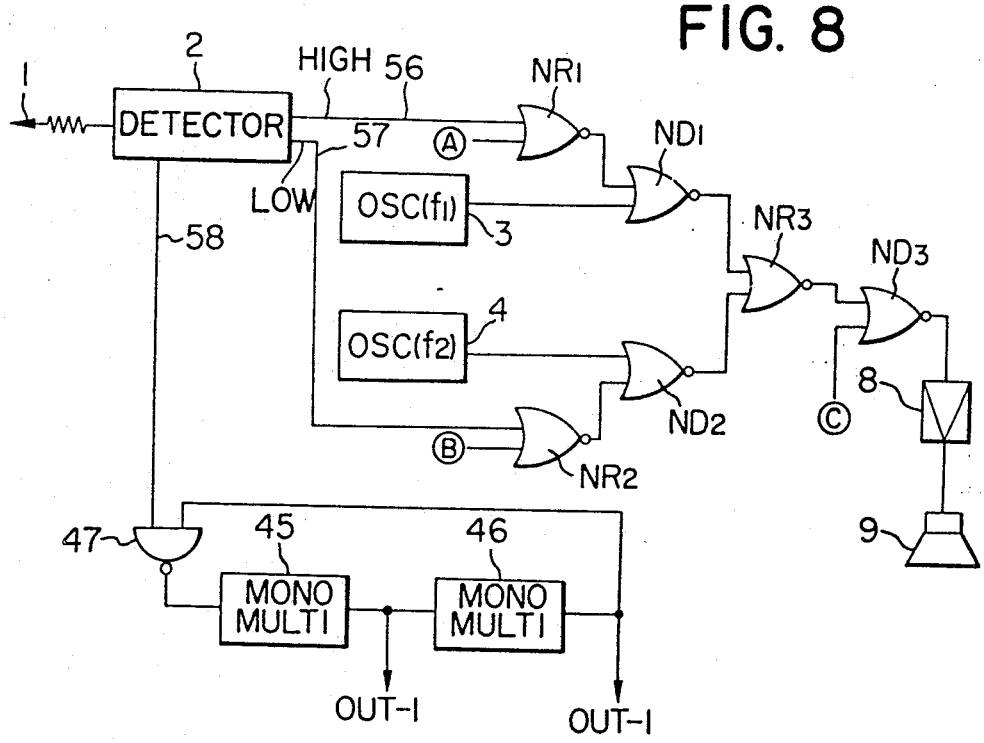
FIG. 8 is a block diagram of a generalized circuit capable of appropriately changing the series of the tone frequencies which are heard through an electroacoustic transducer.

The fourth embodiment illustrated in FIG. 8 is a generalized circuit for attaining the tone frequency series $T_1-T_6$. Except NOR circuits $NR_1$, $NR_2$ and $NR_3$ and NAND circuits $ND_1-ND_3$, the arrangement is similar to the second and third embodiments. The NOR circuit $NR_1$ and the NAND circuit $ND_1$ are used to derive the output of the oscillator 3, whereas $NR_2$ and $ND_2$, to derive the output of the oscillator 4. The high level signal from the detector 2 is applied to one input terminal of the NOR circuit $NR_1$, whereas either of the output OUT-1 or OUT-2 of the monostable multivibrators 45 and 46 is applied to the other terminal Ⓐ depending upon a desired tone frequency series. Similarly either of the output OUT-1 or OUT-2 is applied to the other input terminal Ⓑ of the NOR circuit $NR_2$ and to the other input terminal Ⓒ of the NAND circuit $ND_3$. For example, to attain the $T_4$ series, the output OUT-1 of the multivibrator 45 is applied to the input terminal Ⓑ, whereas the output OUT-2 of the multivibrator 46, to the terminal Ⓐ and the signal "1" is normally applied to the terminal Ⓒ. When the above approach is further advanced, the various combinations can be attained. For example, when three monostable multivibrators are used, the following combinations become possible:

| Series | $T_1$ | $T_2$ | $T_3$ | $T_4$ | $T_5$ | $T_6$ |
|---|---|---|---|---|---|---|
| $\tau_1$ | $f_1$ | $f_1$ | $f_2$ | $f_2$ | 0 | 0 |
| $\tau_2$ | $f_2$ | 0 | $f_1$ | 0 | $f_1$ | $f_2$ |
| $\tau_3$ | 0 | $f_2$ | 0 | $f_1$ | $f_2$ | $f_1$ |

To attain these series, a third monostable multivibrator is added in series to the monostable multivibrator 46 in such a manner that the third multivibrator may be triggered in response to the shift of the multivibrator 46 to the low level state, and the outputs OUT-1, OUT-2 and OUT-3 of the three multivibrators are fed to the terminals Ⓐ, Ⓑ, and Ⓒ according to the above Table. For example, to attain the series $T_5$, the output OUT-1 of the multivibrator 45 is applied to the terminal Ⓒ; the output OUT-2 of the multivibrator 46, to the terminal Ⓐ; and the output OUT-3 of the additional multivibrator to the terminal Ⓑ. Other modifications and variations can be effected without departing from the spirit of the present invention.

One of the novel features of the present invention resides in the circuit 59 in FIG. 6.

As described above, according to the present invention, in order to facilitate the detection with a higher degree of accuracy of the single pulse and the pulse train, means for converting the detected pulse signals such as monostable multivibrators (which are used in the embodiments described above), timer circuits, timing pulse generating means, integrating circuits and the like are used to increase the width of the single pulse and to sample the pulse train. Therefore, there is provided an electronic circuit test equipment simple in construction and capable of testing the electronic circuits with the audio signals.

The OR circuit 59 outputs the signal to the NAND circuit 64 in response to both the signals transmitted from the detector 2 on the lines 56 and 57 as long as the probe 1 is in contact with a circuit under test. As a result the NAND circuit is normally opened so long as the electronic circuit test equipment is in operation, so that any signal from the gates 60–63 is fed to the amplifier 8. In other words, the NAND circuit 64 is ready to open as long as the equipment is in the operation mode. When the probe is out of the contact with the circuit under test, and if the circuit under test is in the high level state immediately before the probe 1 is disconnected, the circuit under test is shifted to the low level state. As a result, the monostable multivibrator 45 is triggered, and thereafter the multivibrator 46 is triggered so that the tone $f_1$ is first heard and then the tone $f_2$ is heard. This will cause the misdetection. To overcome this problem, that is to prevent the tone from being emitted when the probe is disconnected from the circuit under test, the output of the OR circuit 59 is normally applied to the NAND circuit 64. That is, when the probe 1 is disconnected from the circuit under test, the OR circuit 59 immediately stops applying its output to NAND circuit 64 so that the latter is closed. As a consequence, the transducer remains silent. This OR circuit 59 is described above can be of course applied to the circuit shown in FIG. 4. From the foregoing description, it is seen that the advantage of the OR circuit 59 is obvious.

Figure 7:
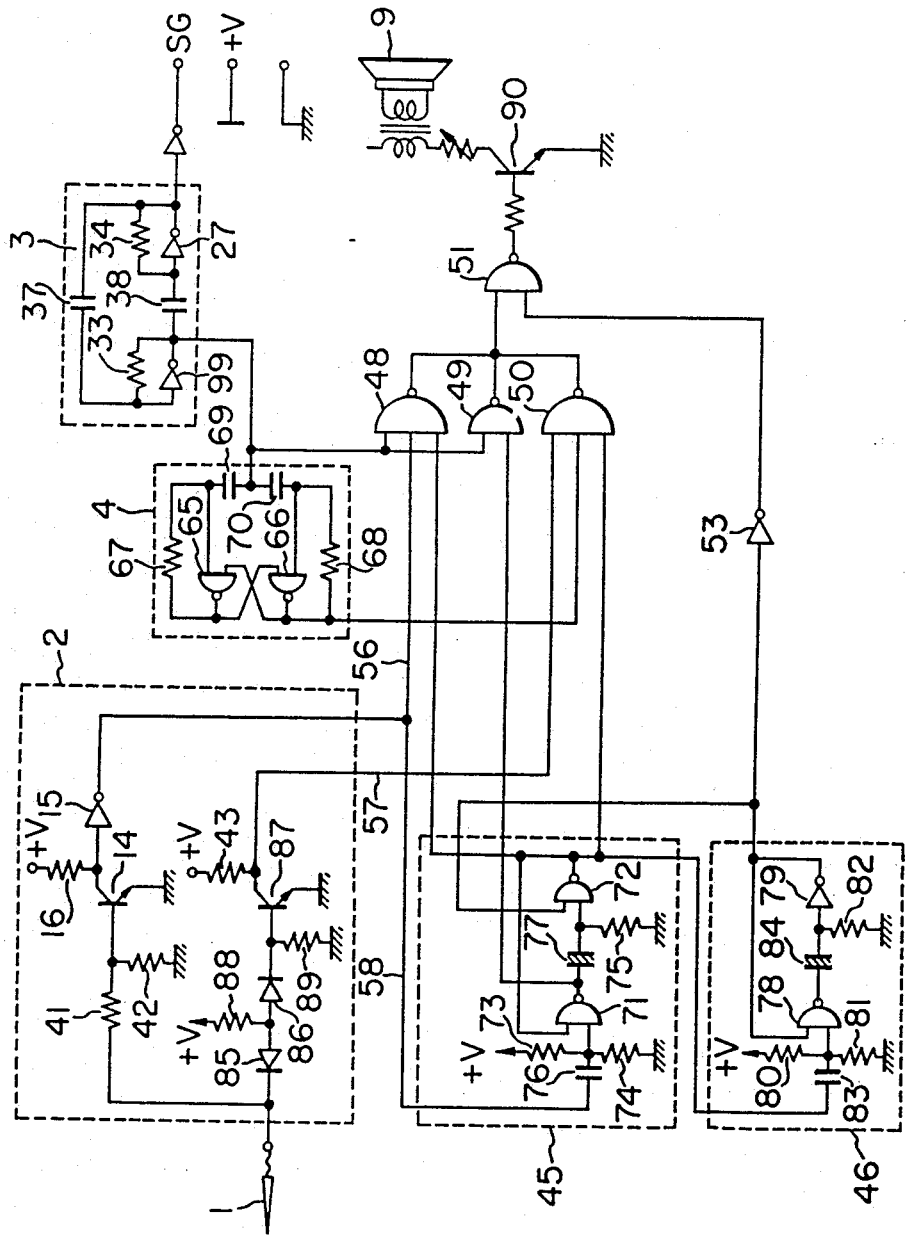
FIG. 7 is a practical circuit diagram of the embodiment shown in FIG. 4.

The practical circuit of the circuit shown in FIG. 4 is illustrated in FIG. 7, in which same reference numerals are used to designated same circuit components. In the circuit shown in FIG. 7, the pulse detecting line 58 in FIG. 4 is branched from the line 56. A flip-flop which oscillates at an oscillation frequency one half of that of the oscillator 3, is used as the oscillator 4. The oscillator or flip-flop 4 comprises in general NAND circuits 65 and 66, resistors 67 and 68, and capacitors 69 and 70. The oscillator 3 is an astable multivibrator comprising, in general, inverters 99 and 27, resistors 33 and 34 and capacitors 37 and 38. The multivibrator 45 comprises, in general, NAND circuits 71 and 72, resistors 73, 74 and 75 and capacitors 76 and 77. The multivibrator 46 comprises, in general, a NAND circuit 78, an inverter 79, resistors 80, 81 and 82, and capacitors 83 and 43, the arrangement of the multivibrator 46 being similar to that of the multivibrator 45. The high level detecting part in the detector 2 is similar in construction to that shown in FIG. 3, but the low level detector comprises a pair of diodes 85 and 86 connected in back-to-back relation, resistors 88, 89 and 43 and a transistor 87. Therefore, the monostable multivibrators 45 and 46 normally generate the high level outputs, that is, they are normally in the high level state. As a result, the output of the monostable multivibrator 45 is applied directly to the NAND circuit 50 without passing through an inverter, and the inverted output to be applied to the NAND circuit 49 is the output of the first NAND circuit 71 in the monostable multivibrator 45. The NAND circuit 47 in FIG. 4 is the NAND circuit 72 in the multivibrator 45.

The output of the oscillator 3 may be derived from a terminal SG. This arrangement is advantageous because various tests and detections can be effected. That is, the oscillator 3 may be used as a signal generator in such a manner that the output thereof may be applied to a circuit under test in order to trace the signal at various points in the circuit under test. The measurement of level can be effected when the level voltage is applied across the +V and 0 terminals. For example, the 0 V terminal is connected to the other terminal thereof, whereby the equipment may be used as a tester for continuity test. Especially when the battery or the like is incorporated in the test equipment, the circuit may be tested without the equipment being connected to a power source.

Figure 9:
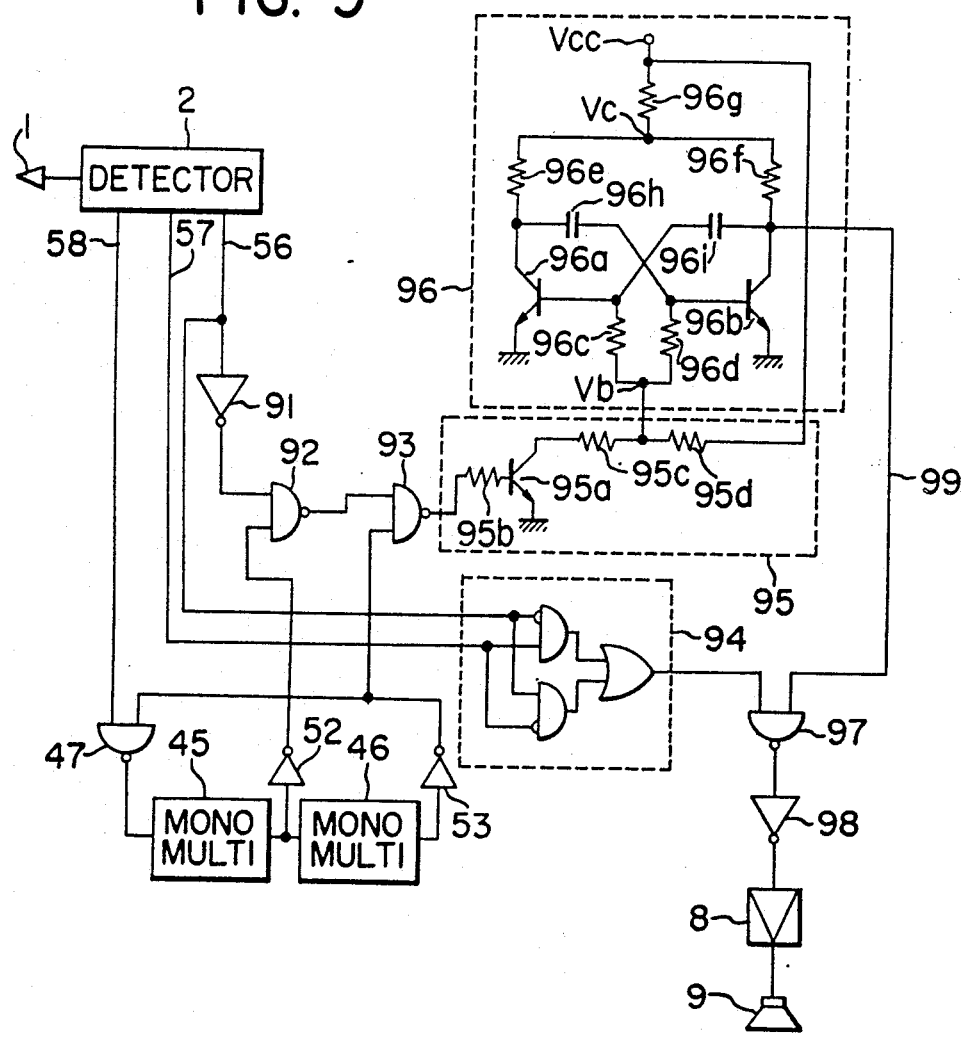
FIG. 9 is a diagram of another embodiment of the present invention in which one oscillator is used to oscillate at different frequencies.

In the circuit shown in FIG. 9, the oscillators 3 and 4 which are used in the circuits described with reference to FIGS. 1–8, are combined into a single oscillator. The high and low level signals detected by the detector 2 are fed to an exclusive OR circuit 94 through the lines 56 and 57 respectively, and the pulse signal is applied to one input terminal of the NAND circuit 47. The high level signal is applied through an inverter circuit 91 to one input terminal of a NAND circuit 93. The output of the exclusive OR circuit 94 is applied to one input terminal of a NAND circuit 97 to the other input terminal of which is applied the output of an oscillator to be described hereinafter. In response to the combinations of the input signals applied to the NAND circuit 97, the output of the oscillator is fed to the transducer 9 through an inverter circuit 98 and the amplifier 8, whereby the output is transduced into the audible signals. The output of the NAND circuit 47 is applied to the input terminal of the first monostable multivibrator 45, the output of which is applied to the input terminal of the monostable multivibrator 46. The output of the monostable multivibrator 46 is applied through the inverter circuit 53 to the other input terminal of the NAND circuit 47. The output of the first multivibrator 45 is applied to the second input terminal of the NAND circuit 92 through the inverter circuit 52, and the output of the NAND circuit 92 is applied to one input terminal of a NAND circuit 93 to the other input terminal of which is applied the output of the inverter circuit 53. The output of the NAND circuit 93 is applied to a switching circuit 95, which comprises a transistor 95a and resistors 95b, 95c and 95d. A voltage controlled type astable multivibrator 96 for oscillating at an audio frequency comprises transistors 96a, 96b, resistors 96c–96g and capacitors 96h and 96i. One end of the resistors 96c and 96d are connected at a junction Vb which in turn is connected to the junction between the resistors 95c and 95d in the switching circuit 95 so that the potential at the junction Vb may be controlled in response to the on-off operation of the transducer 95a. As a result, the oscillation frequency of the multivibrator 96 may be varied. That is, the oscillation frequency of the astable multivibrator 96 is given by $$f = \frac{1}{2Rc \ln(1 + Vcc/Vb)}$$

where
R : 96c and 96d = constant,
C : 96h and 96i = constant, and
Vcc = constant bias voltage.

Figure 10:
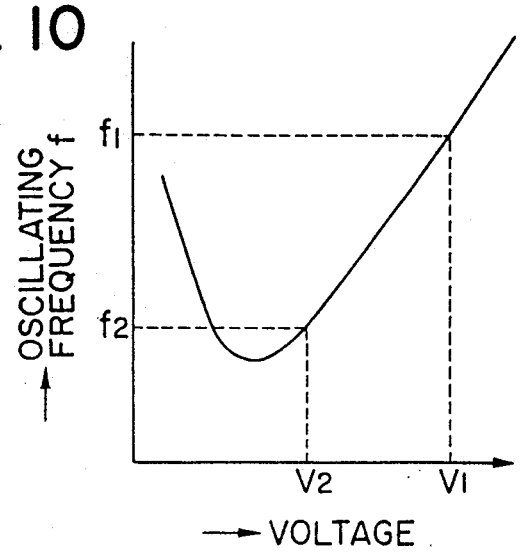
FIG. 10 is a graph used to explain the mode of operation of the embodiment shown in FIG. 9.

Therefore, it is seen that the oscillation frequency $f$ may be varied by varying the voltage Vb. This relation is shown in FIG. 10. The output of the multivibrator 96 is applied to the second input terminal of the NAND circuit 97 through a line 99.

Next the mode of operation will be described. When the probe 1 is not in contact with a circuit under test, the outputs of the detector 2 are all "0" so that the output of the exclusive OR circuit 94 is also "1", but the input applied to the amplifiers 8 is "0" because of the inverter circuit 98 interconnected between the NAND circuit 97 and the amplifier 8. As a consequence, the transducer remains silent. Thus, the operator can see that the probe 1 is out of the contact with the circuit under test.

When the circuit under test is in the high level state, the output "1" appears only on the line 56 from the detector 2, whereas the outputs appearing on the other lines 57 and 58 are "0". As a result, the output of the exclusive OR circuit 94 becomes "1", whereas that of the NAND circuit 97 is "0". Therefore, the output of the inverter 98 is "1", whereby the transducer 9 is driven. The operator can hear the tone through the transducer 9, the tone having the oscillation frequency of the multivibrator 96. In this case, the output of the NAND circuit 92 is "1", and the inputs "1s" are applied to both input terminals of the NAND circuit 93, so that the output of the NAND circuit 93 is "0". Therefore, the transistor 95a in the switching circuit 95 is driven into the non-conduction stage so that the voltage at the junction Vb in the astable multivibrator 96 becomes almost equal to th supply voltage Vc. At this voltage ($V_1$ in FIG. 10) the oscillation frequency is so selected as to correspond to the frequency $f_1$ of the multivibrator 96 as shown in FIG. 10. Thus, when the circuit under test is in the high level state, the tone of $f_1$ is heard through the transducer 9.

Next when the circuit under test is in the low level state, the output "1" of the detector 2 appears only on the signal line 57, whereas "0"outputs appear on the lines 56 and 58. The output of the exclusive OR circuit 94 is "1" whereas the output of the NAND circuit 97 is "0". The output of the inverter circuit 98 is "1". Therefore, the output of the multivibrator 96 is heard through the transducer 9. In this case, the output of the NAND circuit 92 is "0", and the inputs "0" and "1" are applied to the NAND circuit 93 so that the output thereof becomes "1". As a consequence, the transistor 95a in the switching circuit 95 is conducted, and the voltage at the junction Vb has a value Va determined by the ratio of the resistances of the resistors 95c and 95d. Therefore the multivibrator circuit 96 oscillates at the frequency $f2$, which can be easily distinguished from the frequency $f_1$ in case of the high level state.

When the single pulse is detected by the probe 1, the output "1" appears only on the signal line 58. The inputs "1s" are applied to the both input terminals of the NAND circuit so that its output becomes "0". The monostable multivibrator 45 is triggered to output "1", which is inverted to "0" by the inverter circuit 52 and applied to the NAND circuit 92. The outputs "1s" are applied to both the input terminals of the NAND circuit 93 so that its output becomes "0". As a result the transistor 95a in the switching circuit 95 is driven into the non-conduction state, and the tone of $f_1$ is heard through the transducer 9 as in the case of the high level state described above. However, the output of the multivibrator 45 changes from "1" to "0" so that the second monostable multivibrator 46 is triggered to output "1", which is inverted to "0" by the inverter circuit 53. Therefore, the inputs "0s" are applied to both the input terminals of the NAND circuit 93 so that its output becomes "1" to conduct the transistor 95a in the switching circuit 95. Therefore, the oscillation frequency of the multivibrator circuit 96 changes from $f_1$ to $f_2$. Thus, the tone of $f_2$ is heard through the transducer 9, and the single pulse can be detected. In case of the pulse trains, the tones of $f_1$ and $f_2$ are alternately heard through the transducer 9, whereby the pulse train can be readily detected.

Figure 12:
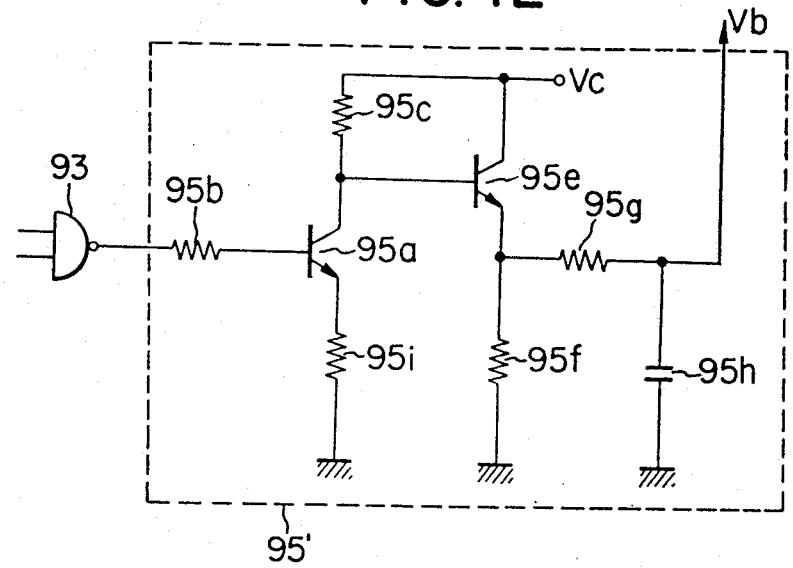
FIG. 12 is a diagram of a switching circuit for continuously changing the oscillation frequency of the oscillator.
Figure 11A:
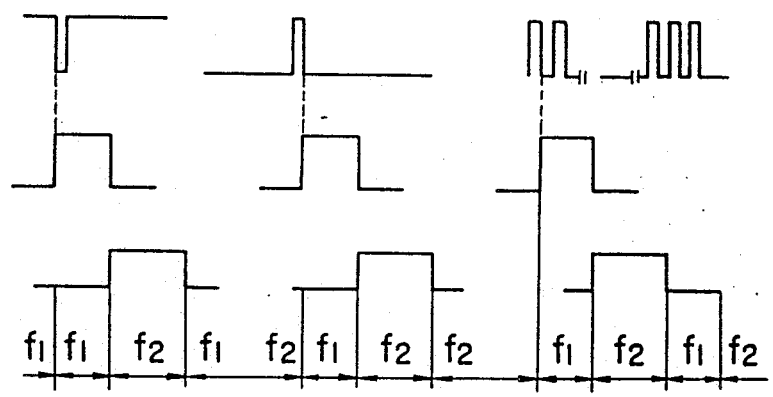
FIG. 11A is a timing chart used to explain the mode of operation of the embodiment shown in FIG. 9.
Figure 11B:
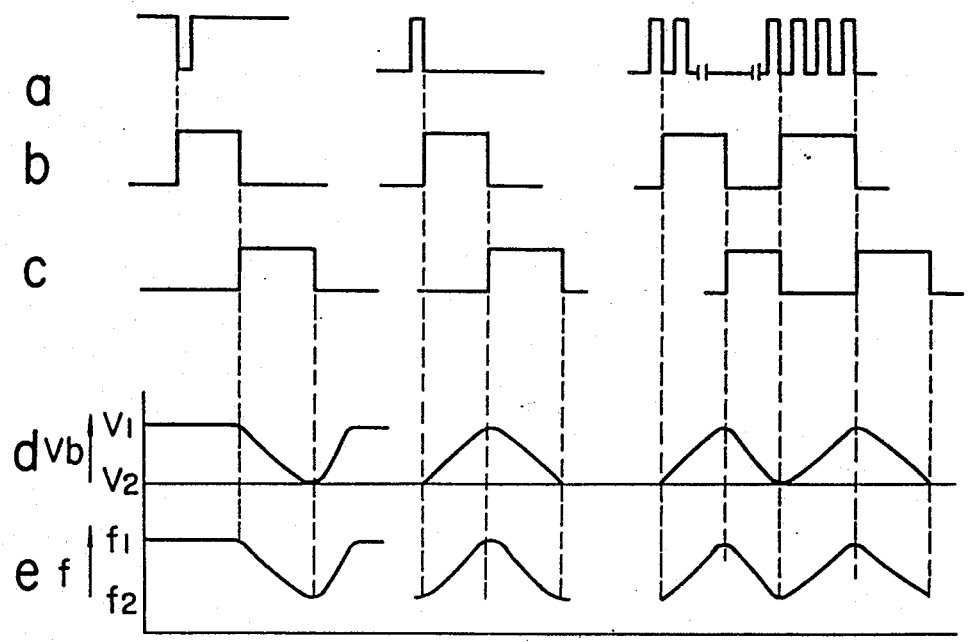
FIG. 11B is a timing chart used for explanation of the mode of continuously changing the oscillation frequency of an oscillator shown in FIG. 12.

As described above, only one oscillator is used in the instant embodiment so that the test equipment may be much simplified. The instant embodiment attains the tone frequency series as shown in FIG. 11A, and it is seen that the switching from $f_1$ to $f_2$ and from $f_2$ to $f_1$ is in a digital manner, because the critical change in Vb occurs. However, when the voltage Vb is changed continuously to some extent, the change in tone or oscillation frequency from $f_1$ to $f_2$ becomes analog as shown in FIG. 11B. This change is preferable from the standpoint of physiology. To attain the analog change in frequency, the voltage Vb must be changed as shown in FIG. 11B-d. This can be attained by the embodiment shown in FIG. 13. The circuit shown in FIG. 12 is similar to that shown in FIG. 9 except that an additional transistor 95e is inserted next to the transistor 95a in the switching circuit 95 to be used as an emitter-follower. The output voltage of the emitter resistor 95f is applied to a primary time delay filter or an integration circuit comprising a resistor 95g and a capacitor 95h. The time constant RC of this filter is selected as to be substantially equal to that of the multivibrators 45 and 46 so that the waveforms as shown in FIG. 11B-d are obtained. As a result, the oscillation frequency of the astable multivibrator 96 which is driven by the voltage Vb becomes as shown in FIG. 11B-e, whereby the tone whose frequency is continuously changing can be heard.

Since the primary time delay filter is provided, when the circuit under test is shifted from the low to high level state, the oscillation frequency of the astable multivibrator 96 changes from $f_2$ to $f_1$ during a time which is equal to the time constant of the astable multivibrator, and changes from $f_1$ to $f_2$. Therefore, the frequency of the tone heard through the transducer 9 changes continuously so that the soft tone can be heard.

A still another novel feature of the present invention is the provision of an illumination element 103 in the head of the probe 1 to illuminate a spot in the circuit being investigated. The remarkable advantage in practice can be accrued from this arrangement. As described hereinbefore, the electronic circuit components are miniaturized extensively so that the assembled equipments are very complex in construction. Therefore it becomes difficult to find out a desired check point because it is very often located behind other component parts and wirings. Since the circuits in these equipments are generally assembled with printed circuit boards, the color of bakelite which is the material of the printed circuit boards is similar to that of the copper-film patterns formed thereupon. Furthermore, the characters or numerals printed on the connectors for printed circuit boards are too small or located behind the lead wires. Therefore, it becomes further difficult to find out a desired check point in a circuit. To overcome this problem, the present invention provides the embodiment illustrated in FIG. 13.

Figure 13:
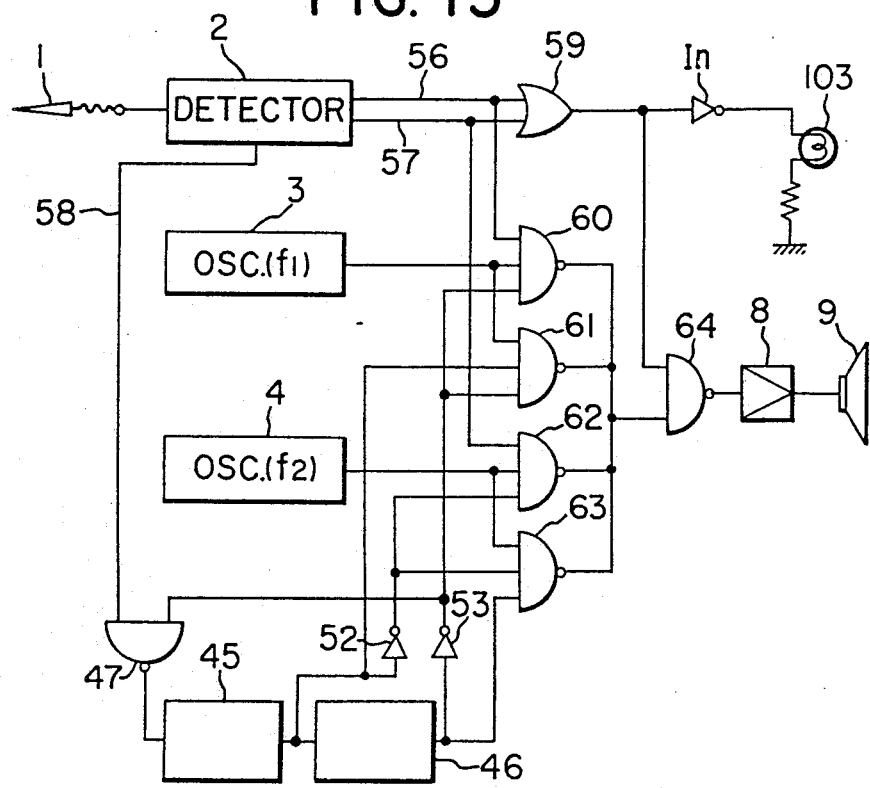
FIG. 13 is a block diagram of another embodiment of the present invention which incorporates an illumination means which is energized to illuminate a desired test point in a circuit or to indicate that the probe is out of contact.

Now referring to FIG. 13, when the probe 1 is out of contact, the signal is not generated from the detector 2 so that the output of the OR circuit 59 is "0". Therefore, the output of an inverter In is "1" so that the illumination element 103 such as a miniature lamp, luminescence diode or the like is energized. Thus, the operator can see that the probe 1 is out of contact. When the probe 1 is made into contact with the circuit under test, and when the circuit under test is in the high or low level state, the output of the OR circuit 59 is "1" which in turn is inverted to "0" by the inverter In. As a result, the illumination element 103 is deenergized. With the aid of this illumination element, the operator can easily find out a desired check point in the circuit, so that the speedy operation can be ensured. From the practical point of view, it is very important that the illumination element 103 is energized when the probe 1 is out of contact because it happens very often that the probe 1 is actually out of contact even though the operator thinks that he has made it into contact with a desired check point in the circuit. However, according to the present invention the operator can confirm very easily whether the probe is actually in contact with a check point or not by the illumination element 103.

Figure 15:
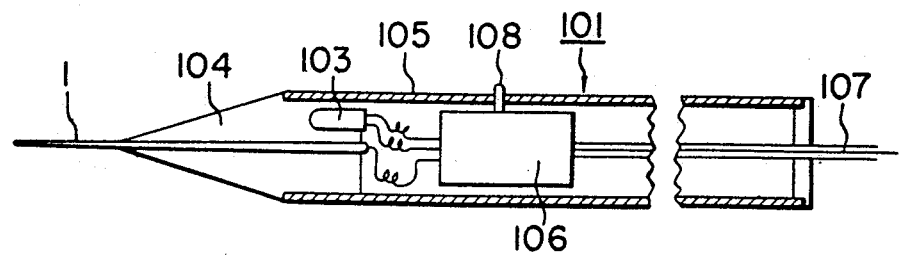
FIG. 15 is a sectional view of a probe assembly incorporating therein the circuit shown in FIG. 13 or FIG. 14.
Figure 16:
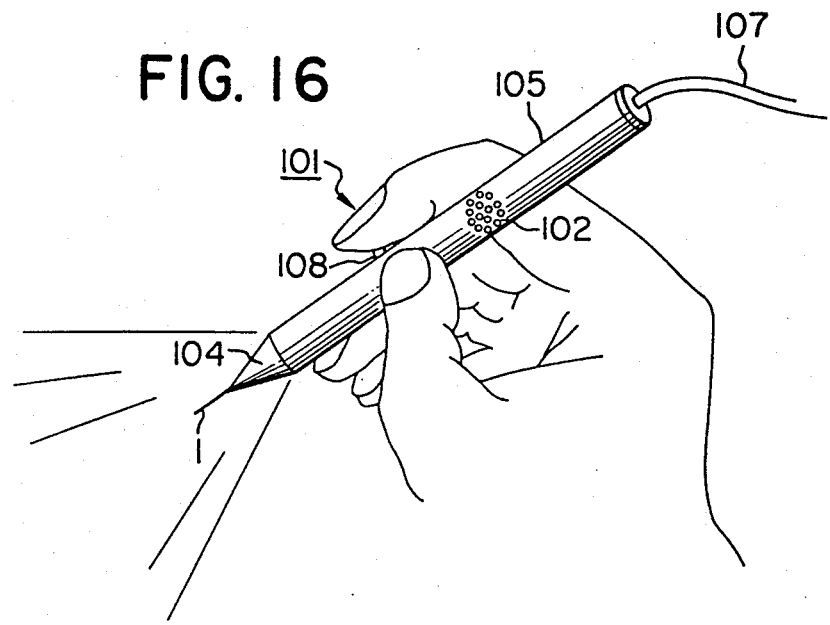
FIG. 16 is a perspective view thereof illustrating how the probe assembly shown in FIG. 15 is used in practice.
Figure 14:
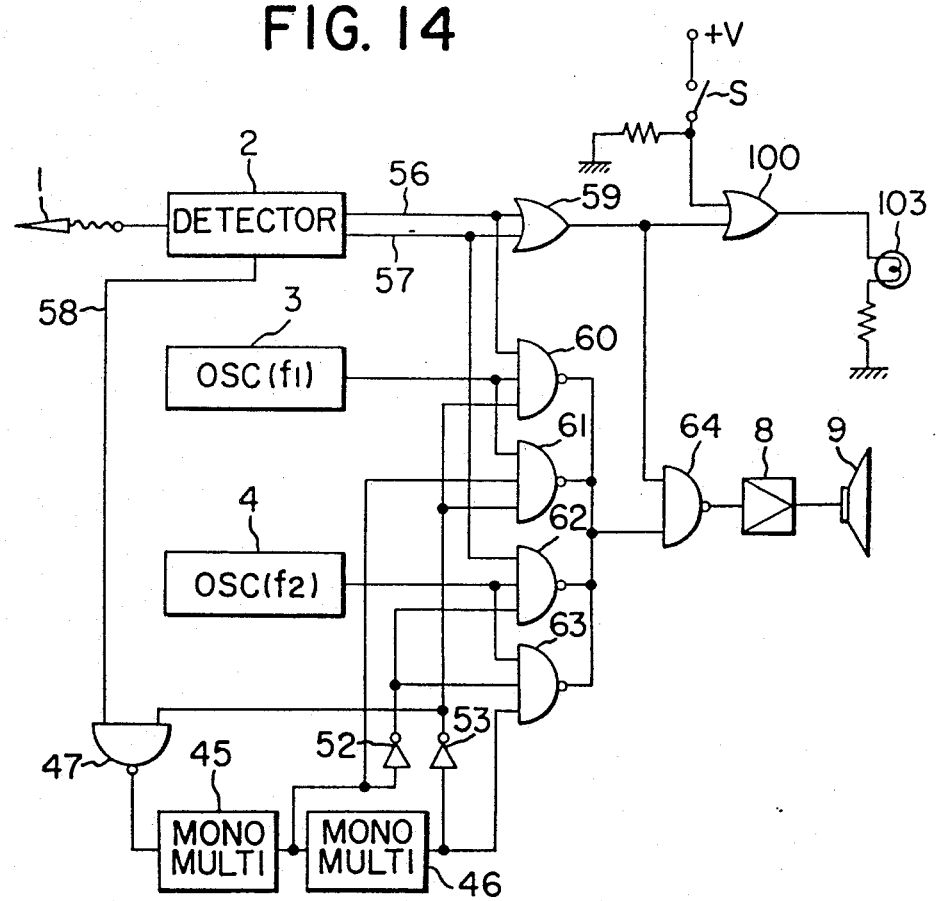
FIG. 14 is a block diagram of another embodiment of the present invention which is similar in construction to that shown in FIG. 13 except that a switch is provided to illuminate a desired test point even after the probe is made into contact with it.

The embodiment illustrated in FIGS. 14–16 is such that the illumination element 103 can be energized by a manual switch S when the operator wishes to confirm the proper contact of the probe 1 with a desired check point. When the switch S shown in FIG. 14 is closed, voltage +V is applied to the illumination circuit 103 through an OR circuit 100, whereby the element 103 is energized. After the operator has confirmed the check point and the contact of the probe therewith, he may open the switch S. Alternatively he may continue to keep the switch S closed to confirm the check point during test, whereby the out-of-contact of the probe 1 or the shortcircuit thereof can be avoided. In the instant embodiment, when the probe 1 is in contact with the check point, the illumination element 103 is energized even when the switch S is opened. Therefore, the operator can positively confirm whether the probe 1 is in contact or out of contact with the check point.

FIG. 15 illustrates a section of a practical probe in which the circuit shown in FIG. 13 or FIG. 14 is incorporated therein, and FIG. 16 is a view used for explanation how the probe is used.

Referring to FIG. 15, the probe assembly generally designated by 101 has a probe 1, and a plurality of perforations 102 for propagation of the tone signals generated by the transducer incorporated in the probe assembly 101. It is seen that the illumination element 103 such as a miniature lamp or luminescence diode is incorporated also in the assembly 101, and emits the illumination light through a head 104 made of a transparent material toward the check point. Since the surface of the transparent head 104 is treated like mat, the illumination light can be easily percieved The detector, the oscillators, the monostable multivibrators, the logic circuits and the transducer described above are all incorporated in a case 106 which in turn is disposed within a probe casing 105. A pair of lead wires 107 are connected to the power source of for example an oscilloscope and the ground. When the test equipment is not used together with the oscilloscope, they are connected to a power source. When the power source is incorporated in the probe assembly, they may be connected to terminal rods for circuit continuity test. The switch S is actuated by a pushbutton 108 so that when the latter is depressed by a finger, the element 103 is energized to illuminate the check point. The energization of the element 103 indicates that the probe 1 is out of contact. From the foregoing description, it is seen that the present invention is very advantageous in practice.

The electronic circuits of the present invention described so far are used to test the electronic circuit condition by the audio signals heard through the transducer. They are not adapted to measure the duty cycle of the pulse train. (The duty cycle is obtained by multiplying the duration of a pulse by the repetition rate, and is used in this specification to refer to the ratio of the duration of a pulse in high level state to that in low level state). The reason why it is difficult to measure the duty cycle from the audio signals heard through the transducer is that the audibility curve changes logarithmically. To overcome this problem, according to the present invention, an additional illumination element is incorporated in the probe assembly in such a manner that the two illumination elements are alternately energized for time intervals corresponding to the duration of the high level of a pulse and to that of the low level, respectively. Therefore, by observing the mixed color of the colors of light emitted from the two illumination elements, the duty pulse can be approximately determined because the man's vision is more sensitive than his sense of hearing so that his eyes can distinguish even a very little difference in intensity of illumination light. The embodiment of the present invention based upon the above described principle will be described hereinafter with reference to FIGS. 17, 18 and 20.

First referring to FIG. 17, an additional illumination element 103' is incorporated in the casing 105, and the associated circuits except those related with the elements 103 and 103' (See FIG. 20) are all incorporated in the case 106. In the instant embodiment, the element 103 is a red electroluminescent diode, whereas element 103', a green electroluminescent diode. When the pulse train arrives at the probe 1, the red and green elements 103 and 103' are alernately energized with durations in proportion to the duty cycle of the pulse. Therefore various colours can be seen depending upon the duty cycles. For example, as the duty cycle changes from 1 to 50, the color changes from red, to orange, from orange to yellow orange, to yellow, to yellow green, and to green. Thus, the duty cycle can be approximately measured from the color of light emitted from the probe assembly.

Referring to FIG. 18, color codes 108 are formed on the surface of the case 105 of the probe assembly 101, and have different colors of light emitted from the probe assembly depending upon the duty cycle of pulse train being measured. The measurement is further facilitated when the numerals representing the duty cycles measured are marked close to the color codes 108. Any suitable color code may be employed, and it is preferable to locate the color codes close to the head 104 and to the illumination elements 103 and 103' so that the color of light emitted from the head 104 can be readily compared with the color codes 108.

Figure 19:
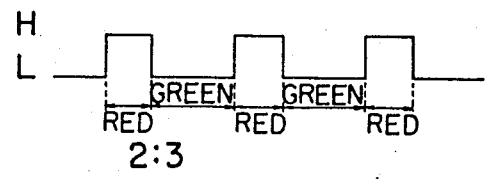
FIG. 19 is a timing chart used to explain the mode of operation of the probe assembly shown in FIG. 17.

In case of the pulse train shown in FIG. 19, the ratio of the duration of the high level of a pulse to that of the low level is 2 : 3 so that light of yellow color is emitted through the head 104. When this color is compared with the color codes, the duty cycle of 0.4 can be readily measured as shown in FIG. 18.

A practical circuit for measurement of duty cycle of a pulse based upon the principle described above is illustrated in FIG. 20. The output of the high level detector stage in the detector 2, that is the output of the inverter 15 is applied to the base of the transistor 109 through a switch $S_1$, and the illumination element 103 for measurement of the duty cycle of a pulse in series with a resistor 111 is connected between the collector base of the transistor 109 and the bias voltage terminal +V of the transistor 14. The output of the low level detector stage of the detector 2, that is the output of the NAND circuit 25 is applied to the base of a transistor 110 through a switch $S_2$, and the illumination element 103' in series with a resistor 112 is connected between the collector of the transistor 110 and the bias voltage terminal +V of the transistor 23. The outputs of the inverters 15 and 25 are applied to the oscillators 3 and 4 through the signal lines 56 and 57, respectively. The switches $S_1$ and $S_2$ are so arranged that their movable contacts close the stationary contacts B and D to open the contacts A and C when the pushbutton 108 is depressed, whereby the illumination elements 103 and 103' are energized to illuminate a desired check point in the circuit under test. From the foregoing description, it is seen that a duty cycle measuring instrument can be readily provided without an extensive modification of the audio type electronic circuit test equipments of the type described hereinbefore. The arrangement and function of the detector 2 are similar to those of the detector described with reference to FIG. 3.

Next the mode of operation will be described. First it is assumed that the circuit under test is in the high level state. The pushbutton 108 is released after the desired check point in the circuit under test has been confirmed to be in contact with the probe 1 so that the movable contacts of the switches $S_1$ and $S_2$ close the contacts A and C. Upon detection of the high voltage level by the probe 1, the base voltage of the transistor 14 is increased. As a result, the transistor 14 is conducted so that the input voltage to the NAND circuit 15 is decreased whereas its output voltage is increased. As a result, the base voltage of the transistor 109 is increased to conduct it. Therefore, the current is supplied to the electroluminescence diode 103 from the power source +V so that it emits red light for a time interval corresponding to 40% of one cycle of a pulse shown in FIG. 19. The high level signal is applied from the collector of the transistor 109 through the line 56 to the oscillator 3. As a result, the tone of $f_1$ is heard through the transducer 9 in a manner described above. Thus, the operator can detect the high level condition of the circuit under test. In this case, the operator can see red light at the head 104 of the probe assembly 101 so that he can also detect the high level state the point in the circuit under test. Therefore, the degree of precision in measurement or detection can be doubled.

During the low level state of the pulse, the current flows into the check point through the diode 21 and the resistor 22, whereby the base voltage of the transistor 23 is decreased. As a consequence, the transistor 23 becomes non-conductive, and the collector output is increased and is applied to the base of the transistor 110 through the two NAND circuits 24 and 25. Therefore the diode 103' is energized to emit green light. The low level signal is applied from the collector of the transistor 110 through the line 57 to the oscillator 4 so that the tone of $f_2$ can be heard through the transducer 9. Thus, the operator can detect that the check point is in the low level state from both the tone of $f_2$ and green light emitted through the head 104 of the probe assembly 101. In this case, green light is emitted for a time interval equal to 60% of one cycle of the pulse shown in FIG. 19.

When the repetitive pulses as shown in FIG. 19 are generated at the check point, red and green light are alternately emitted in the manner described above so that the mixed color can be observed. From the color appearing at the head 104, the operator can readily measure the duty cycle of the pulse train as 0.4 in the manner described in detail hereinabove. From the foregoing description, it is seen that the operator can detect the electrical condition at the check point in the circuit under test and the duty cycle of the pulse train if the electrical condition is the pulse train without moving his eyes. Thus the measurement or detection can be much facilitated.

Figure 21:
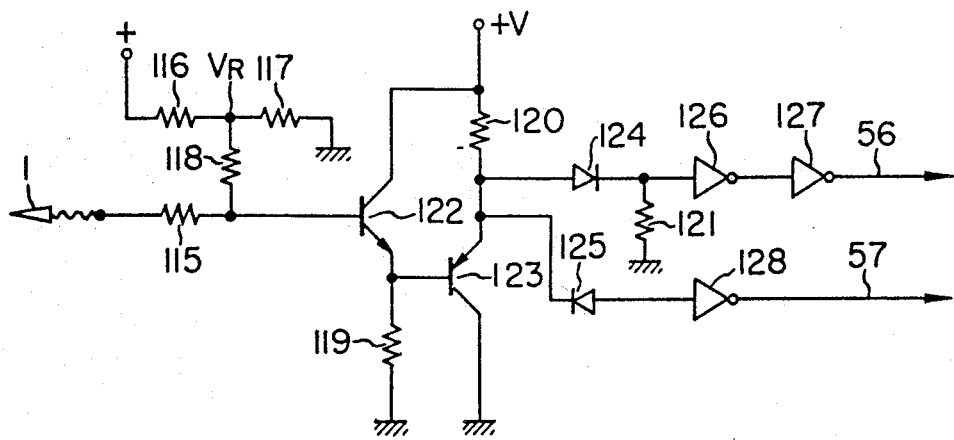
FIG. 21 is a circuit diagram of one variation of the detector in accordance with the present invention.

Next two variations of the detector 2 will be described with reference to FIGS. 21 and 22, respectively.

All of the embodiments of the present invention are constituted by TTL (Transistor Transistor Logic) circuits or DTL Diode Transistor Logic) circuits, whose threshold voltage is of the order of 1.4 volts and output, of the order of 5 volts. It is seen therefore that other IC, ISI and transistor logic circuits can be used in the present invention without departing from the scope of the present invention. However, since the voltage levels are varied, the constants of the circuit components must be changed accordingly. The detector 2 shown in FIG. 2 also comprises TTLs or DTLs that is, resistors 115–121, transistors 122 and 123, diodes 124 and 125 and inverters 126–128. It is clear that the inverters may be constituted by utilizing one input line of a NAND circuit, and that instead of the inverters, IC NAND circuits may be used. The voltage $V_R$ is so determined by the voltage dividing resistors 116 and 117 as to be equal to the threshold voltage (1.4 volts) of the inverters 126–128. The value of the resistor 118 is so high that the value of the resistor 115 may be negligible. The transistors 122 and 123 of the resistor 115 may be negligible. The transistors 122 and 123 are emitter followers, and the base voltage of the transistor 122 is always equal to the emitter voltage of the transistor 123. When the probe 1 is out of contact, the base voltage of the transistor 122 is $V_R$ so that the emitter voltage of the transistor 123 is also $V_R$. Therefore, the input to the inverter 126 is $V_R$ minus the forward voltage drop (about 0.6 V in case of a silicon diode) of the diode 124 so that the output of the inverter 126 is "1". Consequently the output of the inverter 127 is "0". On the other hand, the input to the inverter 128 is $V_R$ plus the reverse voltage drop across the diode 125 so that the output of the inverter 128 is "0". Therefore, the transducer remains silent.

When the probe 1 detects a high voltage level $V_1$, the base voltage of the transistor 122 becomes substantially equal to the high voltage level $V_1$ since the resistor 118>> resistor 115. Therefore when $V_1 - V_R > V_D$, the input to the inverter 126 becomes "1". The output of the inverter 127 becomes "1", whereas the output of the inverter 128 remains "0". When the probe 1 detects a low level voltage Vo, the input to the inverter 128 becomes "0", whereas its output, "1" when $V_R -$ Vo $< V_D$. The output of the inverter 127 is "0".

Figure 22:
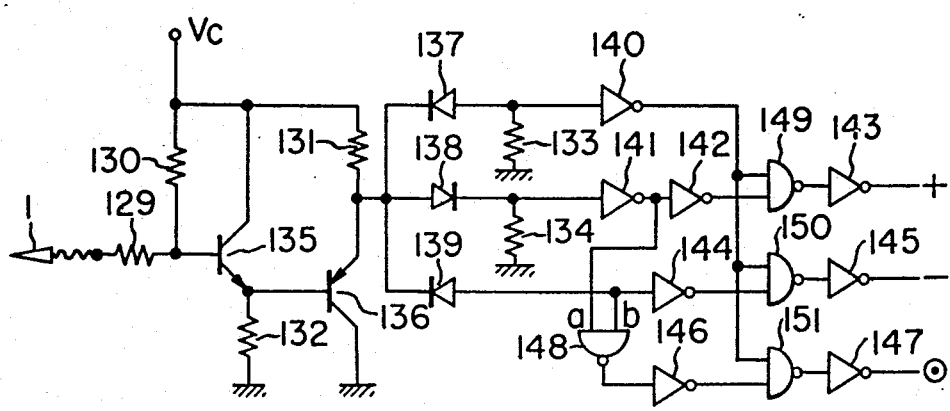
FIG. 22 is a circuit diagram of another variation of the detector in accordance with the present invention capable of detecting three discrete values and adapted to be used in testing or measuring ternary logic circuits.

The circuit shown in FIG. 22 is adapted to detect three discrete levels or values in a ternary logic circuit which has been found wide applications in many fields. Whereas the binary logic uses only two discrete values "0" and "1", the ternary logic uses "+", "−", and "⊙" to effect the arithmetic operations, controls and the like.

The three-discrete value detector shown in FIG. 22 comprises resistors 129–134, transistors 135 and 136, a Zener diode 137, diodes 138 and 139, inverters 140–147, and NAND circuits 148–151. The voltage Vcc applied to the collector of the transistor 135, to the emitter of the transistor 136 and to the resistor 130 is so selected as to have a value different from the three discrete values. (In the instant embodiment, Vcc is higher than the three discrete values). As in the case of the circuit shown in FIG. 21, the resistor 130 >> the resistor 129. When the probe 1 is out of contact, the base voltage of the transistor 135 is substantially equal to Vcc so that the emitter voltage of the transistor is also substantially equal to Vcc. When $Vcc - V_z > V_T$ (where $V_z$ = zener voltage of the diode 137, and $V_T$ = threshold voltage, about 1.4 volts in the instant embodiment), the output of the inverter 140 becomes "0". Therefore, all of the output of the inverters 143, 145 and 147 become "0s". When the probe detects the positive voltage $V_1$, the base voltage of the transistor 135 becomes almost $V_1$ since the resistor 130 >> resistor 129. Therefore, when $V_1 - V_z < V_T$ the output of the inverter 140 becomes "1". As a result, the NAND circuits 149, 150 and 151 are opened. When $V_1 - V_D > V_T$ the signals pass through the inverters 141 and 142 and the NAND circuit 149 so that the output of the inverter 143 becomes "1". Since the input to the inverter 144 is "1", the output of the inverter 145 is "0". Since the input to one terminal a of the NAND circuit 148 is "0", the output of the inverter 147 is "0".

When the negative voltage Vo is detected by the probe 1, the output of the inverter 140 becomes "1". Since the input to the inverter 141 is "0", the output of the inverter 143 is "0". In this case the input to the inverter 144 is "0" so that the output of the inverter 145 becomes "1". Since the input to the other input terminal b of the NAND circuit 148 is "0", the output of the inverter 147 is "0". When the voltage ⊙ V at ⊙ level is detected by the probe 1, the input to the inverter 138 becomes "0" when $V_\odot - V_D < V_T$, and the output of the inverter 141 becomes "1". Since V + $V_D V_T$, the input to the inverter 144 is "1". As a result, the inputs "1s" are applied to the input terminals a and b of the NAND circuit 148 so that the output of the inverter 147 is "1", whereas the outputs of the other inverters 143 and 145 are "0s".

The audio type electronic circuit test equipment described above is superior to the prior art equipment in its simplicity in construction and operation and in its reliability in test or measurement, and is very advantageous in practice. Furthermore, the defect of the audio type electronic circuit test equipment can be overcome by the provision of the display device of the type described above.

What is claimed is:

1. Logic level test equipment comprising:
   a probe for sensing electrical signals from a digital circuit under test,
   a probe body having a head portion and having said probe mounted at said head portion,
   detecting means having an input coupled to said probe for detecting the level of said signals,
   illuminating means disposed at said head portion of said probe body for illuminating a desired portion of the digital circuit under test,
   control means coupled to said detecting means and responsive to an output therefrom for energizing said illuminating means when said probe is in a non-contact condition with the digital circuit under test, and for deenergizing said illuminating means when said probe contacts the digital circuit,
   gate means having a first output, and having first and second inputs, said first input being coupled to said detecting means,
   oscillator means connected to said second gate means input for providing an audio signal at said output of said gate means in response to the application of signals from said detecting means to said first input of said gate means, and
   electroacoustic transducer means coupled to said gate means output for converting said audio signal into audible signals.

2. Logic level test equipment as set forth in claim 1 wherein said control means for energizing and de-energizing said illumination means includes a gate coupled between said detector means and said illuminating means for applying an energizing signal to said illuminating means only when said detecting means does not detect a signal from said probe.

3. Logic level test equipment as set forth in clam 1, further comprising manually operable switch means for energizing said illuminating means independently of said control means.

4. Electronic circuit test equipment comprising a probe for sensing electrical signals from a circuit under test,
   detecting means connected for receiving said electrical signals from said probe and for detecting the level thereof,
   a first detected signal converting means coupled to said detecting means for being triggered in response to a variation in level of the output from said detecting means, a second detected signal converting means coupled to said first detected signal converting means for being triggered in response to a variation in level of the output from said first detected signal converting means,
   a first oscillator means for providing an output signal when the signal from said detecting means is at a predetermined high level, a second oscillator means for providing an output signal when the signal from said detecting means is at a predetermined low level,
   a first OR gate having a first input terminal coupled to said detecting means for receiving said predetermined high level signal, and having a second input terminal coupled to the output of one of said first and second detected signal converting means, a second OR gate having a first input terminal coupled to said detecting means for receiving said predetermined low level signal, and having a second input coupled to the output of either of said first and second detected signal converting means,
   a first AND gate having a first input coupled to the output of said first OR gate and a second input coupled to said first oscillator means, a second AND gate having a first input coupled to the output of said second OR gate, and a second input coupled to said second oscillator means,
   a third OR gate having first and second inputs coupled respectively to the outputs of said first and second AND gates, a third AND gate having first and second inputs coupled respectively to the output of said third OR gate and the output of either of said first or second detected signal converting means, and
   electroacoustic transducer means which is driven by said third AND gate means, whereby a plurality of electrical conditions in the circuit under test can be converted into a plurality of tones of different frequencies audible to an operator.

5. Logic level test equipment comprising a probe for sensing electrical signals from a circuit under test,
   detecting means connected for receiving said electrical signals from said probe and for detecting the level thereof and for providing predetermined high and low level output signals in response to said electrical signal, a first detected signal converting means coupled to said detecting means for being triggered in response to a variation in level of the output from said detecting means, a second detected signal converting means for being triggered in response to a variation in level of the output from said first detected signal converting means, a switching circuit having inputs coupled to said detecting means and to said first and second detected signal converting means, said switching circuit having an output for providing variations in voltage in response to signals at said inputs thereof, oscillator means having an input coupled to said switching circuit output for providing an output signal which varies in frequency in response to said variations in output voltage from said switching circuit, AND gate means having an output, a first input coupled to said oscillator means, and a second input coupled to said detecting means for coupling said oscillator means output to said AND gate means output in response to the presence of signals detected by said detecting means, and electroacoustic transducer means connected for being driven by said AND gate means, whereby a plurality of electrical conditions in the circuit under test can be converted into a plurality of the tones of different audible frequencies.

6. Logic level test equipment as set forth in claim 5, wherein
said switching circuit includes a primary time delay filter connected to said oscillator means fo continuously changing the oscillator frequency of said oscillator said in response to predetermined signals sensed by said probe.

7. Logic level test equipment as set forth in claim 6, further comprising OR gate means having an output terminal, and a pair of inputs coupled respectively to receive said predetermined high and low level signals from said detecting means, and illumination means connected to be energized by the output of said OR gate means.

8. Logic level test equipment as set forth in claim 7, wherein said probe has a forwardly disposed head portion, and wherein said illumination means is disposed in said head portion of siad probe.

9. Logic level test equipment as set forth in claim 7, wherein
a manually operable switch is mounted on said probe and connected to said illumination means to permit energization and de-energization of said illumination means.

10. Logic level test equipment as set forth in claim 9, further comprising an OR gate circuit having a first input terminal connected to one end of said switch, having a second input terminal connected to the output terminal of said OR gate means, and having an output terminal connected to said illumination means.

11. Logic level test equipment comprising:
a probe for sensing electrical signals in a circuit under test,
a probe body having a head portion and having said probe mounted at said head portion,
detecting means coupled to said probe and including a first stage for detecting electrical signals of a predetermined first level, first illumination means connected to the output of said first level signal detecting stage, a second stage for detecting electrical signals of a predetermined second level, and second illumination means connected to the output of said second level signal detecting stage for emitting light having color of wavelength different from that of said first illumination means, said first and second illumination means being mounted at said head portion of said probe body,
manual switch means mounted on said probe body and coupled to said first and second illumination means for operation to cause both said illumination means to emit light independently of said first and second detecting means signals,
gate means having an output and having first and second inputs, wherein said first input is coupled selectively to one of said first and second stages of said detecting means,
oscillator means having an output coupled to said second input of said gate means for providing an audio frequency signal for coupling through to said gate means output when said signal from said detecting means is applied to said first gate means input, and
electroacoustic transducer means coupled to said gate means output for converting said audio signal into an audible tone.

12. Logic level test equipment as set forth in claim 11 wherein the combination of color wavelengths emitted by said first and second illumination means varies in response to variations in the duty cycle of pulses sensed by said probe, and further comprising color code means disposed on said head portion of said probe for comparison with said combination of color wavelengths to index said duty cycle variations.

* * * * *

UNITED STATES PATENT OFFICE
CERTIFICATE OF CORRECTION

Patent No. 3,944,921                    Dated   March 16, 1976

Inventor(s)  SHIN TSUDA and RYOZO HIRAGA

It is certified that error appears in the above-identified patent and that said Letters Patent are hereby corrected as shown below:

IN THE TITLE - delete "GRATED" and insert --GATED--.

IN THE ABSTRACT - third line, change "audible." to --audible,--.

Column 1, line 2, delete "GRATED" and insert --GATED--.

Column 1, line 10, after "equipment" insert --, and more particularly to an electronic circuit test equipment--.

Column 4, line 6, change "continuty" to --continuity--.

Column 6, line 25, after "voltage" insert --level--.

Column 9, line 18, delete "is";

Column 9, line 63, after "to" insert --one terminal of the circuit under test, whereas the probe is connected to--.

Column 10, line 41, delete "transducer" and insert --transistor--;

Column 10, line 62, after "also" insert --"0", whereas the output of the NAND circuit 97 is--;

Column 10, line 63, change "amplifiers" to --amplifier--.

Column 11, line 17, delete "th" and insert --the--;

Column 11, line 42, change "inputs "1s"" to read --inputs "1"s--;

Column 11, line 42, delete "the".

UNITED STATES PATENT OFFICE
CERTIFICATE OF CORRECTION

Patent No. 3,944,921            Dated March 16, 1976

Inventor(s) SHIN TSUDA and RYOZO HIRAGA

It is certified that error appears in the above-identified patent and that said Letters Patent are hereby corrected as shown below:

Column 16, line 9, change "Diode" to read --(Diode--;

Column 16, line 54, delete "been".

Column 17, line 9, change ""0s"" to read --"0"s--;

Column 17, line 33, change ""1s"" to read --"1"s--;

Column 17, line 36, change ""0s"" to read --"0"s--.

Column 18, <u>Claim 3</u>, line 1, delete "clam" and insert --claim--.

Column 19, <u>Claim 6</u>, line 4, change "fo" to --for--;

line 5, change "oscillator" to --oscillation-- line 6, delete "said" and insert --means--.

Signed and Sealed this

Sixth Day of July 1976

[SEAL]

Attest:

RUTH C. MASON
*Attesting Officer*

C. MARSHALL DANN
*Commissioner of Patents and Trademarks*